(12) United States Patent
Luo et al.

(10) Patent No.: US 9,960,384 B2
(45) Date of Patent: May 1, 2018

(54) ORGANIC LIGHT EMITTING DIODE PACKAGING METHOD AND PACKAGING STRUCTURE AND DEVICE HAVING THE SAME

(71) Applicant: BOE Technology Group Co., Ltd., Beijing (CN)

(72) Inventors: Chengyuan Luo, Beijing (CN); Chun-Jan Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 34 days.

(21) Appl. No.: 15/121,889

(22) PCT Filed: Oct. 14, 2015

(86) PCT No.: PCT/CN2015/091922
§ 371 (c)(1),
(2) Date: Aug. 26, 2016

(87) PCT Pub. No.: WO2016/201831
PCT Pub. Date: Dec. 22, 2016

(65) Prior Publication Data
US 2017/0155083 A1 Jun. 1, 2017

(30) Foreign Application Priority Data
Jun. 16, 2015 (CN) .......................... 2015 1 0333965

(51) Int. Cl.
*H01L 51/52* (2006.01)
*H01L 51/56* (2006.01)
*H01L 51/00* (2006.01)

(52) U.S. Cl.
CPC ...... *H01L 51/5253* (2013.01); *H01L 51/0097* (2013.01); *H01L 51/56* (2013.01);
(Continued)

(58) Field of Classification Search
CPC .. H01L 51/5253; H01L 51/0097; H01L 51/56
See application file for complete search history.

(56) References Cited

U.S. PATENT DOCUMENTS 7,816,676 B2    10/2010   Fourst et al.
9,029,847 B2     5/2015   Lee et al.
(Continued)

FOREIGN PATENT DOCUMENTS

CN    101218692 A    7/2008
CN    103337595 A    10/2013
(Continued)

OTHER PUBLICATIONS

International Search Report and Written Opinion, including English translation of Box No. V, for International Application No. PCT/CN2015/091922, dated Jan. 13, 2016, 11 pages.
(Continued)

*Primary Examiner* — Douglas Menz
(74) *Attorney, Agent, or Firm* — Westman, Champlin & Koehler, P.A.

(57) ABSTRACT

The present invention discloses a packaging method for an organic light emitting diode including: providing a first substrate that is made of metallic foil; providing an organic light emitting diode on the first substrate; providing, outside the organic light emitting diode, a passivation layer for covering the organic light emitting diode; coating an encapsulation adhesive onto the first substrate entirely, so that the encapsulation adhesive covers the passivation layer; providing a second transparent substrate at least on a portion of the encapsulation adhesive covering the passivation layer; and curing the encapsulation adhesive, to form a package of the organic light emitting diode. The present invention also
(Continued)

discloses a packaging structure for an organic light emitting diode, and an organic light emitting diode device having the packaging structure.

17 Claims, 2 Drawing Sheets

(52) U.S. Cl.
CPC .... *H01L 51/5259* (2013.01); *H01L 2251/301* (2013.01); *H01L 2251/5338* (2013.01)

(56) References Cited

U.S. PATENT DOCUMENTS

| | | | |
|---|---|---|---|
| 9,159,952 | B2 | 10/2015 | Zhang et al. |
| 2014/0198435 | A1 | 7/2014 | Yeh et al. |
| 2015/0102332 | A1 | 4/2015 | Shin et al. |
| 2015/0349289 | A1* | 12/2015 | Yu .................... H01L 27/32 362/97.1 |
| 2016/0174366 | A1 | 6/2016 | Yeh et al. |

FOREIGN PATENT DOCUMENTS

| | | |
|---|---|---|
| CN | 103794625 A | 5/2014 |
| CN | 104538557 A | 4/2015 |
| CN | 104576689 A | 4/2015 |
| FR | 2 938 375 A1 | 5/2010 |
| JP | 2000-123968 A | 4/2000 |
| TW | 201428955 A | 7/2014 |

OTHER PUBLICATIONS

First Office Action, including Search Report, for Chinese Patent Application No. 201510333965.7, dated Aug. 30, 2016, 20 pages.

Office Action for Chinese Patent Application No. 201510333965.7, dated Nov. 16, 2016.

Reexamination Notification from Chinese Patent Application 201510333965.7, dated Jul. 13, 2017, 21 pages.

Decision of Reexamination for Chinese Patent Application No. 201510333965.7, dated Sep. 27, 2017, 33 pages.

* cited by examiner

ORGANIC LIGHT EMITTING DIODE PACKAGING METHOD AND PACKAGING STRUCTURE AND DEVICE HAVING THE SAME

CROSS-REFERENCE TO RELATED APPLICATIONS

This application is a Section 371 National Stage Application of International Application No. PCT/CN2015/091922, filed on 14 Oct. 2015 and entitled with "ORGANIC LIGHT EMITTING DIODE PACKAGING METHOD AND PACKAGING STRUCTURE AND DEVICE HAVING THE SAME", which claims priority to Chinese Application No. 201510333965.7, filed on Jun. 16, 2015, which are incorporated herein by reference in their entirety.

BACKGROUND

1. Technical Field

The present disclosure relates to the field of electronic components, and particularly to an organic light emitting diode packaging method, a packaging structure and an organic light emitting diode device having the packaging structure.

2. Description of the Related Art

Organic light emitting diode (OLED) is a display and lighting device that is gradually being concerned in recent years, and its characteristic of flexible displaying is especially favored by people. However, OLED devices will be damaged by corrosion under the action of water vapor and oxygen, so the OLED devices currently should be protected by a packaging structure. On the other hand, for achieving flexibility of the OLED, it is required to replace conventional glass substrate by flexible substrate. Flexible substrates used currently mainly includes: ultra-thin glass, metallic foil, plastic film or the like. Plastic film is most used at present since it has characteristics including treatability and surface smoothness. However, plastic film has lower barrier property to water and oxygen, and thus a barrier layer used to obstruct water and oxygen is necessary to be added below electric circuit when plastic film is used as a flexible substrate, so as to ensure the device's ability of resisting water and oxygen. Metallic foil has a strong barrier effect but has no light transmission property, and thus encounters certain limitations when in use. Ultra-thin glass has perfect light transmission property and high barrier effect, but it is difficult to be processed.

Referring to FIG. 1, which is a schematic view showing a conventional packaging structure for an organic light emitting diode device, OLED 2 is disposed on a first substrate 1 made of plastic film, a passivation layer 3 for covering the OLED 2 is disposed on the OLED 2, and, encapsulation adhesive 4 is coated on the first substrate entirely 1 so that the passivation layer 3 is covered by the encapsulation adhesive 4. In addition, a second transparent substrate 5 is disposed on the encapsulation adhesive 4. In this structure, the OLED device adopts a bottom emission configuration, in which light is emitted from the first substrate 1 made of plastic film. However, a top emission configuration, due to its high aperture ratio and micro-cavity effect utilization, gets more attentions and is expected to be used in OLED device. In addition, although, in this configuration, the encapsulation adhesive is adopted to protect the OLED, water and oxygen will still permeate inside of the OLED packaging structure through the encapsulation adhesive, which leads to damage to the OLED.

Thereby, it is expected to achieve a flexible OLED in which use and structure of a substrate are optimized to provide an improved packaging effect so as to manufacture an OLED device with prolonged service life.

SUMMARY

In accordance with a first aspect of the present invention, there provides a packaging method for an organic light emitting diode comprising: providing a first substrate that is made of metallic foil; providing an organic light emitting diode on the first substrate; providing, outside the organic light emitting diode, a passivation layer for covering the organic light emitting diode; coating an encapsulation adhesive onto the first substrate entirely, so that the encapsulation adhesive covers the passivation layer; providing a second transparent substrate at least on a portion of the encapsulation adhesive covering the passivation layer; and curing the encapsulation adhesive, to form a package of the organic light emitting diode.

In accordance with a second aspect of the present invention, there provides an organic light emitting diode packaging structure comprising: a first substrate made of metallic foil; an organic light emitting diode provided on the first substrate; a passivation layer covering the organic light emitting diode; an encapsulation adhesive provided on the first substrate entirely, so that the encapsulation adhesive covers the passivation layer; and a second transparent substrate provided at least on a portion of the encapsulation adhesive covering the passivation layer.

In accordance with a third aspect of the present invention, there provides an organic light emitting diode device comprising the abovementioned organic light emitting diode packaging structure.

BRIEF DESCRIPTION OF THE DRAWINGS

Features and advantages of the present invention will become apparent and more readily appreciated from the accompanying drawings. It should be understood that the accompanying drawings are used for schematic purposes, but not to limit the present invention. In the accompanying drawings.

DETAILED DESCRIPTION OF THE EMBODIMENTS

Technical solutions disclosed in these embodiments of the present invention will be described hereinafter clearly and completely with reference to the attached drawings. Obviously, the embodiments illustrated in these drawings are only some of embodiments of the present invention, instead of all of the embodiments of the present invention. For those skilled in the art, other embodiments achieved by referring to the following embodiments without involving any inventive steps fall into the scope of the present invention.

In addition, in the following description, lots of the details are expounded to provide a full understanding of these embodiments disclosed, for explanation purposes. Obviously, however, one or more embodiments can be implemented without involving these details. In other situations, well-known structures and devices are illustrated by a way of representations in order to simplify the drawings.

Figure 2:
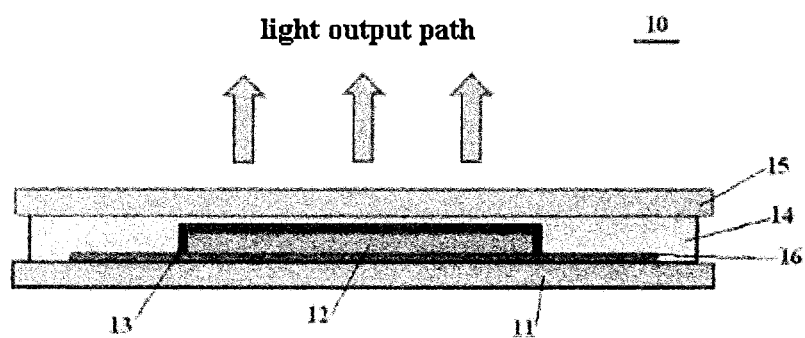
FIG. 2 is a schematic view showing an organic light emitting diode packaging structure according to one embodiment of the present invention.

Referring to FIG. 2, an organic light emitting diode packaging structure 10 according to one embodiment of the present invention comprises: a first substrate 11 made of metallic foil; an organic light emitting diode (OLED) 12 provided on the first substrate 11; a passivation layer 13 covering the organic light emitting diode; an encapsulation adhesive 14 provided on the first substrate entirely 11, the encapsulation adhesive 14 covering the passivation layer 13; and a second transparent substrate 15 provided at least on a portion of the encapsulation adhesive 14 covering the passivation layer 13.

In this embodiment, the first substrate 11 is made of metallic foil, and the second substrate 15 is a transparent substrate. As a result, a top emission configuration is achieved. And, instead of using generally a plastic film, the metallic foil is used, so that the manufactured flexible OLED packaging structure has an enhanced barrier property to water and oxygen and thus an additional barrier layer is omitted. The second substrate 15 may be made of glass, quartz, plastic or the like.

In one embodiment, the metallic foil comprises stainless steel foil, Invar alloy, Kovar alloy, or the like, having a lower thermal expansion coefficient. Use of the metallic foil having a lower thermal expansion coefficient can prevent deformation induced by heating in manufacturing process of a device, thereby avoiding it being peeled off from other structures after being cooled. In a preferred embodiment, the first substrate has a thickness of 50 µm-100 µm.

Figure 1:
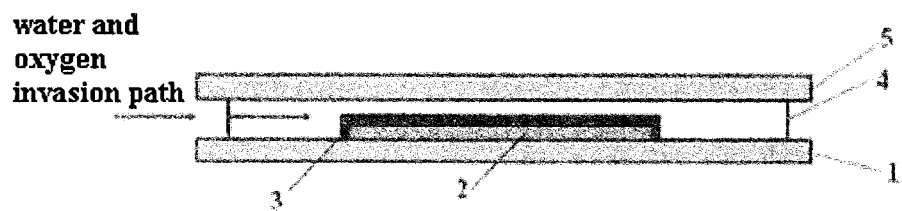
FIG. 1 is a schematic view showing a conventional packaging structure for an organic light emitting diode device.
Figure 3:
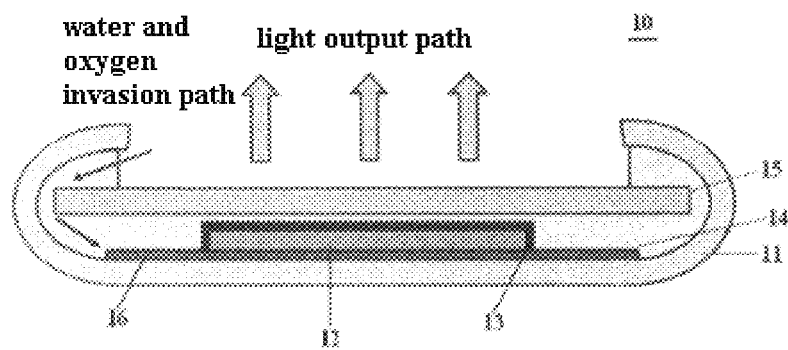
FIG. 3 is a schematic view showing an organic light emitting diode packaging structure according to another embodiment of the present invention.

Referring to FIG. 3, in another embodiment of the present invention, an area of a major surface of the second transparent substrate 15 is less than an area of a major surface of the first substrate 11, that is, the second transparent substrate 15 is smaller than the first substrate 11. And, at least one edge of the first substrate 11 as well as the encapsulation adhesive 14 provided thereon is folded to enwrap a corresponding edge of the second transparent substrate 15. With such an enwrapping configuration, water and oxygen invasion path is prolonged compared to the conventional OLED packaging structure shown in FIG. 1, enhancing a packaging effect. It should be noted that, "major surface of the substrate" mentioned herein represents a flat surface defined by the length and width of the substrate.

In one embodiment, referring to FIG. 3, the edge folded of the first substrate 11 is located on the second transparent substrate 15 within a region, which is not served as a light emitting region, of the second transparent substrate 15, while the encapsulation adhesive 14 is provided between the at least one edge folded of the first substrate 11 and the second transparent substrate 15. With such a configuration, on one hand, the edge of the second transparent substrate 15 is enwrapped by the folded edge of the first substrate 11, which prolongs a water and oxygen invasion path; on the other hand, a light output path will not be affected and thus a top emission configuration is achieved since the portion of the second transparent substrate 15 serving as the light emitting region is not covered. In a preferred embodiment, a distance from the folded edge of the first substrate 11 to the corresponding enwrapped edge of the second transparent substrate 15 is 0 mm-1 mm.

It should be noted that, at least one edge of the first substrate 11 is not folded such that internal circuit of the OLED packaging structure can be connected to an outside. Preferably, two opposite edges of the first substrate 11 are folded to enwrap two corresponding opposite edges of the second transparent substrate 15.

In one embodiment, a planarization layer 16 may be provided. Referring to FIGS. 2 and 3, the planarization layer 16 is provided between the organic light emitting diode OLED 12 and the first substrate 11, for improving a flatness of the first substrate 11. The planarization layer 16 may be a $SiN_x$, SiCn or $SiO_2$ film having a thickness of 0.1 µm-1 µm, which is formed on the first substrate 11 by means of chemical vapor deposition (CVD), physical vapor deposition (PVD) or the like; or may be a plastic film having a thickness of 0.5 µm-1 µm, which adheres to the first substrate 11 by being heated or by means of an adhesive. An area of the planarization layer 16 is greater than an area of a portion of the second transparent substrate 15 serving as the light emitting region but is less than a coverage area of the second transparent substrate 15. The coverage area indicates an area of the second transparent substrate 15 covering over the encapsulation adhesive 14.

Figure 4:
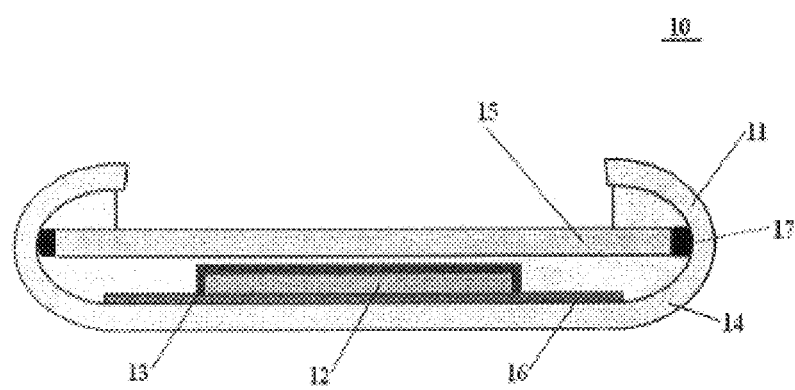
FIG. 4 is a schematic view showing an organic light emitting diode packaging structure according to yet another embodiment of the present invention.

Referring to FIG. 4, in yet another embodiment of the present invention, a desiccant or waterabsorbent 17 may be provided, at the corresponding enwrapped edge of the second transparent substrate 15. The desiccant or waterabsorbent 17 may be at least one of Ca, Ba, Mg, CaO and BaO.

In one embodiment, the encapsulation adhesive 14 may be UV-curing resin adhesive or heat-curing resin adhesive, including: homopolymer or copolymer of monomers, such as epoxy resin, epoxypropyl acrylate, epoxypropyl methacrylate, methyl methacrylate, ethyl methacrylate, n-butyl methacrylate, poly(6,7-epoxyheptyl methacrylate), 2-hydroxyethyl methacrylate and the like, melamine formaldehyde resin, unsaturated polyester resin, silicone resin, furan resin and the like. In one embodiment, the passivation layer 13 may be formed from one of $SiN_x$, SiCN, $SiO_2$, SiNO and $Al_2O_3$, by means of chemical vapor deposition (CVD), physical vapor deposition (PVD), atomic layer deposition (ALD) or the like.

In accordance with another aspect of the present invention, there provides an organic light emitting diode device comprising the organic light emitting diode packaging structure according to any one of the abovementioned embodiments.

A packaging method performed by means of the organic light emitting diode packaging structure according to the embodiments of the present invention will be further described hereinafter in details with reference to FIGS. 2-4.

A packaging method for an OLED according to an embodiment of the present invention comprises: providing a first substrate 11 that is made of metallic foil; providing an organic light emitting diode OLED 12 on the first substrate 11; providing, outside the organic light emitting diode, a passivation layer 13 for covering the organic light emitting diode 12; coating an encapsulation adhesive 14 onto the first substrate entirely 11, so that the encapsulation adhesive 14 covers the passivation layer 13; providing a second transparent substrate 15 on a portion of the encapsulation adhesive 14 covering the passivation layer 13; and, curing the encapsulation adhesive 14, to form a package of the organic light emitting diode. As mentioned above, a flexible OLED packaging structure manufactured has an enhanced barrier property to water and oxygen, and no additional barrier lay is required to be added.

In one embodiment, an area of a major surface of the second transparent substrate 15 is less than an area of a major surface of the first substrate 11; and, the packaging method further comprises: folding, before the curing the encapsulation adhesive 14, at least one edge of the first substrate 11 as well as the encapsulation adhesive 14 provided thereon so that the at least one edge of the first substrate and the encapsulation adhesive enwrap a corresponding edge of the second transparent substrate 15, as shown in FIG. 3. Here, the metallic foil may comprise stainless steel foil, Invar alloy or Kovar alloy, having a lower thermal expansion coefficient. Also, the first substrate 11 may have a thickness of 50 µm-100 µm.

Moreover, the step of folding at least one edge of the first substrate 11 as well as the encapsulation adhesive 14 provided thereon so that the at least one edge of the first substrate and the encapsulation adhesive enwrap a corresponding edge of the second transparent substrate 15 comprises: folding the at least one edge of the first substrate 11 as well as the encapsulation adhesive provided thereon onto the second transparent substrate 15 within a region, which is not served as a light emitting region, of the second transparent substrate 15, while the encapsulation adhesive 14 is provided between the at least one edge folded of the first substrate 11 and the second transparent substrate 15. In one embodiment, a distance from the at least one edge folded of the first substrate 11 to the corresponding edge enwrapped of the second transparent substrate 15 is 0 mm-1 mm.

In one embodiment, the packaging method further comprises: providing a planarization layer 16 between the organic light emitting diode 12 and the first substrate 11. The planarization layer 16 having a thickness of 0.1 µm-1 µm may be formed of a $SiN_x$, SiCN or $SiO_2$ film, by means of chemical vapor deposition (CVD), physical vapor deposition (PVD) or the like; or the planarization layer 16 having a thickness of 0.5 µm-1 µm may be formed of a plastic film adhered by being heated, by means of an adhesive, or the like.

In one embodiment, the packaging method further comprises: providing a desiccant or waterabsorbent 17 at the corresponding edge enwrapped of the second transparent substrate 15. The desiccant or waterabsorbent 17 may be at least one of Ca, Ba, Mg, CaO and BaO.

Hereafter are two particular examples of a packaging method for an organic light emitting diode according to embodiments of the present invention.

Example 1

Invar alloy having a thickness of 50 µm is provided as a first substrate, and, a $SiN_x$ film having a thickness of 0.5 µm, as a planarization layer, is formed by means of CVD on the first substrate. An OLED is manufactured on the planarization layer. A $SiN_x$ film having a thickness of 1 µm, as a passivation layer, is formed by means of CVD and the passivation layer covers the OLED. Encapsulation adhesive is coated onto surface of the first substrate and covers the first substrate entirely. A plastic film, as a second substrate, is provided at least on a portion of the encapsulation adhesive covering the passivation layer. An area of a major surface of the second substrate is less than an area of a major surface of the first substrate. An edge of the first substrate is folded to enwrap the second substrate while a light emitting region is exposed, meanwhile one edge of the first substrate is kept unfolded so that a circuit portion can be extended to outside. Finally, the encapsulation adhesive is cured, to form a packaging structure of the organic light emitting diode.

Example 2

Kovar alloy having a thickness of 100 µm is provided as a first substrate, and, a plastic film having a thickness of 0.5 µm, as a planarization layer, is adhered evenly by means of being heated on the first substrate. An OLED structure is manufactured on the planarization layer. An $Al_2O_3$ film having a thickness of 0.5 µmm, as a passivation layer, is formed by means of atomic layer deposition (ALD) and the passivation layer covers the OLED. Encapsulation adhesive is coated onto surface of the first substrate and covers the first substrate entirely. A plastic film, as a second substrate, is provided at least on a portion of the encapsulation adhesive covering the passivation layer. An area of a major surface of the second substrate is less than an area of a major surface of the first substrate. An edge of the first substrate is folded to enwrap the second substrate while a light emitting region is exposed, meanwhile one edge of the first substrate is kept unfolded so that a circuit portion can be extended to outside. Finally, the encapsulation adhesive is cured, to form a packaging structure of the organic light emitting diode.

Concerning the above, the organic light emitting diode packaging method, the packaging structure and the organic light emitting diode device having the abovementioned packaging structure according to embodiments of the present invention are capable of achieving an improved packaging effect, acquiring an increased light emitting region and enhancing a barrier property to water and oxygen, so as to prolong service life of an organic light emitting diode device.

Obviously, it would be appreciated by those skilled in the art that various changes or modifications may be made on these embodiments of the present invention without departing from the principles and spirit of the present invention. Accordingly, the present invention intends to contain these changes or modifications if they fall into the scope which is defined in the claims and their equivalents of the present invention.

What is claimed is:

1. A packaging method for an organic light emitting diode, comprising:
   providing a first substrate that is made of stainless steel foil, Invar alloy or Kovar alloy;
   providing an organic light emitting diode on the first substrate;
   providing, outside the organic light emitting diode, a passivation layer for covering the organic light emitting diode;
   coating an encapsulation adhesive onto the first substrate entirely, so that the encapsulation adhesive covers the passivation layer;
   providing a second transparent substrate at least on a portion of the encapsulation adhesive covering the passivation layer, wherein an area of a major surface of the second transparent substrate is less than an area of a major surface of the first substrate;
   folding at least one edge of the first substrate as well as the encapsulation adhesive provided thereon so that the at least one edge of the first substrate and the encapsulation adhesive enwrap a corresponding edge of the second transparent substrate;

filling completely a desiccant or a water absorbent at the corresponding edge enwrapped of the second transparent substrate; and curing the encapsulation adhesive, to form a package of the organic light emitting diode.

2. The packaging method of claim 1, wherein, the step of folding at least one edge of the first substrate as well as the encapsulation adhesive provided thereon so that the at least one edge of the first substrate and the encapsulation adhesive enwrap a corresponding edge of the second transparent substrate comprises: folding the at least one edge of the first substrate as well as the encapsulation adhesive provided thereon onto the second transparent substrate within a region, which is not served as a light emitting region, of the second transparent substrate, while the encapsulation adhesive is provided between the at least one edge folded of the first substrate and the second transparent substrate.

3. The packaging method of claim 1, further comprising: providing a planarization layer between the organic light emitting diode and the first substrate.

4. The packaging method of claim 1, wherein, the step of folding at least one edge of the first substrate as well as the encapsulation adhesive provided thereon so that the at least one edge of the first substrate and the encapsulation adhesive enwrap a corresponding edge of the second transparent substrate comprises: folding two opposite edges of the first substrate as well as the encapsulation adhesive provided thereon so that they enwrap two corresponding edges of the second transparent substrate.

5. The packaging method of claim 1, wherein, the first substrate has a thickness of 50 μm-100 μm.

6. An organic light emitting diode packaging structure, comprising:

a first substrate made of stainless steel foil, Invar alloy or Kovar alloy;

an organic light emitting diode provided on the first substrate;

a passivation layer covering the organic light emitting diode;

an encapsulation adhesive provided on the first substrate entirely, so that the encapsulation adhesive covers the passivation layer; and a second transparent substrate provided at least on a portion of the encapsulation adhesive covering the passivation layer;

wherein, an area of a major surface of the second transparent substrate is less than an area of a major surface of the first substrate; and, at least one edge of the first substrate as well as the encapsulation adhesive provided thereon is folded to enwrap a corresponding edge of the second transparent substrate; and a desiccant or a water absorbent is filled completely at the corresponding edge enwrapped of the second transparent substrate.

7. The packaging method of claim 6, wherein, a distance from the at least one edge folded of the first substrate to the corresponding edge enwrapped of the second transparent substrate is 0 mm-1 mm.

8. The organic light emitting diode packaging structure of claim 6, wherein, the edge folded of the first substrate is located on the second transparent substrate within a region, which is not served as a light emitting region, of the second transparent substrate, while the encapsulation adhesive is provided between the at least one edge folded of the first substrate and the second transparent substrate.

9. The organic light emitting diode packaging structure of claim 8, wherein, a distance from the at least one edge folded of the first substrate to the corresponding edge enwrapped of the second transparent substrate is 0 mm-1 mm.

10. The organic light emitting diode packaging structure of claim 6, further comprising: a planarization layer provided between the organic light emitting diode and the first substrate.

11. The organic light emitting diode packaging structure of claim 10, wherein, an area of the planarization layer is greater than an area of a portion of the second transparent substrate serving as the light emitting region but is less than a coverage area of the second transparent substrate.

12. The organic light emitting diode packaging structure of claim 6, wherein, the desiccant or the waterabsorbent is at least one of Ca, Ba, Mg, CaO and BaO.

13. The organic light emitting diode packaging structure of claim 6, wherein, the at least one edge of the first substrate comprises two opposite edges of the first substrate.

14. The organic light emitting diode packaging structure of claim 6, wherein, the passivation layer is formed from one of $SiN_x$, SiCN, $SiO_2$, SiNO and $Al_2O_3$.

15. The organic light emitting diode packaging structure of claim 6, wherein, the organic light emitting diode packaging structure is for a top emission configuration.

16. An organic light emitting diode device, comprising an organic light emitting diode packaging structure of claim 6.

17. The organic light emitting diode packaging structure of claim 6, wherein, the first substrate has a thickness of 50 μm-100 μm.

* * * * *